United States Patent
Csutak

(10) Patent No.: US 7,902,545 B2
(45) Date of Patent: Mar. 8, 2011

(54) SEMICONDUCTOR FOR USE IN HARSH ENVIRONMENTS

(75) Inventor: Sebastian Csutak, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 351 days.

(21) Appl. No.: 12/120,562

(22) Filed: May 14, 2008

(65) Prior Publication Data

US 2009/0283748 A1    Nov. 19, 2009

(51) Int. Cl.
 H01L 29/06      (2006.01)
 H01L 31/072     (2006.01)
 H01L 31/109     (2006.01)
 H01L 31/0328    (2006.01)
 H01L 31/0336    (2006.01)

(52) U.S. Cl. ............................ 257/14; 257/94; 257/98

(58) Field of Classification Search ................ 257/14, 257/94, 98, E29.076
See application file for complete search history.

(56) References Cited

U.S. PATENT DOCUMENTS

| | | | |
|---|---|---|---|
| 5,303,775 A | 4/1994 | Michaels et al. | |
| 5,519,721 A | 5/1996 | Takano | |
| 6,207,481 B1 * | 3/2001 | Yi et al. | 438/166 |
| 6,317,446 B1 | 11/2001 | Wipiejewski | |
| 7,312,468 B2 | 12/2007 | Watanabe et al. | |
| 7,326,963 B2 | 2/2008 | Gaska et al. | |
| 7,348,606 B2 | 3/2008 | Khan et al. | |
| 7,642,562 B2 * | 1/2010 | Kovsh et al. | 257/98 |
| 2002/0008245 A1 * | 1/2002 | Goetz et al. | 257/87 |
| 2002/0163639 A1 | 11/2002 | Stephenson | |
| 2003/0214989 A1 | 11/2003 | Takase | |
| 2004/0061858 A1 | 4/2004 | Pope et al. | |
| 2004/0098202 A1 | 5/2004 | McNeil, III et al. | |
| 2004/0222431 A1 | 11/2004 | Flynn et al. | |
| 2005/0007583 A1 | 1/2005 | DiFoggio | |
| 2005/0099618 A1 | 5/2005 | DiFoggio et al. | |
| 2007/0051962 A1 * | 3/2007 | Lai | 257/94 |
| 2007/0081157 A1 | 4/2007 | Csutak et al. | |
| 2007/0108456 A1 | 5/2007 | Wong et al. | |
| 2007/0108547 A1 * | 5/2007 | Zhu et al. | 257/471 |
| 2007/0109537 A1 | 5/2007 | Vannuffelen et al. | |
| 2007/0159625 A1 | 7/2007 | DiFoggio | |
| 2007/0171414 A1 | 7/2007 | Vannuffelen et al. | |
| 2007/0215901 A1 * | 9/2007 | Shibata | 257/189 |
| 2008/0030729 A1 | 2/2008 | DiFoggio | |

OTHER PUBLICATIONS

Asano, Takeharu et al., 100-mW Kink-Free Blue-Violet Laser Diodes With Low Aspect Ratio, IEEE Journal of Quantum Electronics, Jan. 2003, pp. 135-140, vol. 39, No. 1.

Guo, Xiangyi et al., Demonstration of Ultraviolet Separate Absorption and Multiplication 4H-SiC Avalanche Photodiodes, IEEE Photonics Technology Letters, Jan. 1, 2006, pp. 136-138, vol. 18 No. 1.

(Continued)

*Primary Examiner* — Phuc T Dang
(74) *Attorney, Agent, or Firm* — Cantor Colburn LLP

(57) ABSTRACT

A gallium-nitride semiconductor apparatus may include an active region having one or more nitride-based barrier layers that are modulation-doped using a nitride-based doped layer. An active region may have at least two nitride-based barrier layers, and a nitride-based blocking layer may be disposed between the at least two barrier layers.

20 Claims, 5 Drawing Sheets

OTHER PUBLICATIONS

Kamiyama, Satoshi et al., Recent Progress in Nitride-based UV Light Emitters, IEEE, 2005, pp. 724-725.

Kamiyama, Satoshi et al., Laser Diode With 350.9-nm-Lasing Wavelength Grown by Hetero-Epitaxial-Lateral Overgrowth Technology, IEEE Journal of Selected Topics in Quantum Electronics, Sep./Oct. 2005, pp. 1069-1073, vol. 11, No. 5.

Shchekin, O.B. et al., 1.3 um InAs quantum dot laser with T0=161 K from 0 to 80 C, Applied Physics Letters, May 6, 2002, pp. 3277-3278, vol. 80, No. 18, American Institute of Physics.

International Search Report and Written Opinion, Mailed Jan. 13, 2010, International Appln. No. PCT/US2009/043800, Written Opinion 6 Pages, International Search Report 4 Pages.

* cited by examiner

SEMICONDUCTOR FOR USE IN HARSH ENVIRONMENTS

BACKGROUND

1. Technical Field

The present disclosure generally relates to well bore tools and in particular to apparatus and methods for downhole formation testing.

2. Background Information

Oil and gas wells have been drilled at depths ranging from a few thousand feet to as more than 5 miles. Wireline and drilling tools often incorporate various sensors, instruments and control devices in order to carry out any number of downhole operations. These operations may include formation testing, fluid analysis, and tool monitoring and control.

The environment in these wells present many challenges to maintain the tools used at depth due to vibration, harsh chemicals and temperature. Temperature in downhole tool applications presents a unique problem to these tools. High downhole temperatures may reach as high as 200° C. (390° F.) or more, and sensitive electronic equipment usually requires cooling in order to work in the hazardous environment. An added problem is that space in the carrier assembly is usually limited to a few inches in diameter.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

Disclosed is a gallium-nitride semiconductor apparatus may include an active region having one or more nitride-based barrier layers that are modulation-doped using a nitride-based doped layer.

In another aspect, a gallium-nitride semiconductor apparatus includes an active region having at least two nitride-based barrier layers, and a nitride-based blocking layer may be disposed between the at least two barrier layers.

BRIEF DESCRIPTION OF THE DRAWINGS

For a detailed understanding of the present disclosure, reference should be made to the following detailed description of the several non-limiting embodiments, taken in conjunction with the accompanying drawings, in which like elements have been given like numerals and wherein.

DESCRIPTION OF EXEMPLARY EMBODIMENTS

The present disclosure uses terms, the meaning of which terms will aid in providing an understanding of the discussion herein. As used herein, high temperature refers to a range of temperatures typically experienced in oil production well boreholes. For the purposes of the present disclosure, high temperature and downhole temperature include a range of temperatures from about 100° C. to about 200° C. (about 212° F. to about 390° F.).

Figure 1:
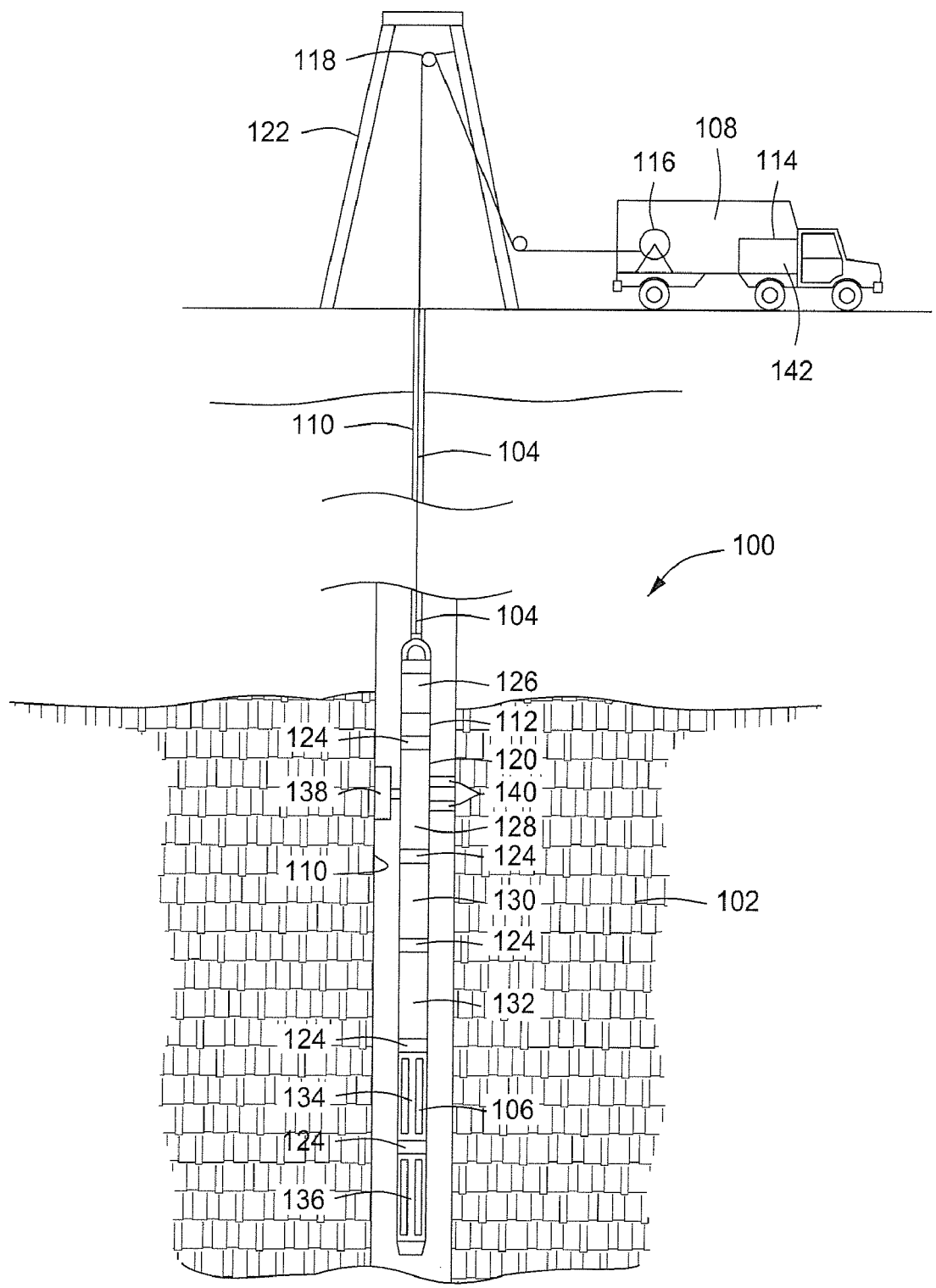
FIG. 1 is an exemplary wireline system according to several embodiments of the disclosure.

FIG. 1 schematically illustrates a non-limiting example of a wireline apparatus 100 according to several disclosed embodiments. In the example shown, a well borehole 110 traverses several subterranean formations 102. The well borehole 110 will typically be filled or at least partially filled with a fluid mixture which can include various gases, water, drilling fluid, and formation fluids that are indigenous to the subterranean formations penetrated by the well borehole. Such fluid mixtures are referred herein to as "well borehole fluids".

A formation evaluation tool 120 is conveyed in the well borehole 110 using a wire line 104. Wire line deployment and retrieval may be performed by a powered winch carried by a service truck 108, for example. The wireline 104 typically is an armored cable that carries data and power conductors for providing power to the formation evaluation tool 120 and to provide two-way data communication between a tool processor 112 and a controller 114 that may be carried by the service truck 108. The wireline 104 typically is carried from a spool 116 over a pulley 118 supported by a derrick 122. The spool 116 may be carried by the truck 108 as shown for on-land operations, by an offshore rig for underwater operations, or by any other suitable mobile or fixed supporting structure. The controller 114 may include a processor 142, such as within a computer or a microprocessor, data storage devices, such as solid state memory and magnetic tapes, peripherals, such as data input devices and display devices, and other circuitry for controlling and processing data received from the tool 120. The surface controller 114 may further include one or more computer programs embedded in a computer-readable medium accessible to the processor 142 in the controller 114 for executing instructions contained in the computer programs to perform the various methods and functions associated with the processing of the data from the tool 120.

The exemplary wireline FIG. 1 operates as a carrier for the formation evaluation tool 120, but any carrier is considered within the scope of the disclosure. The term "carrier" as used herein means any device, device component, combination of devices, media and/or member that may be used to convey, house, support or otherwise facilitate the use of another device, device component, combination of devices, media and/or member. Exemplary non-limiting carriers include drill strings of the coiled tube type, of the jointed pipe type and any combination or portion thereof. Other carrier examples include casing pipes, wirelines, wireline sondes, slickline sondes, downhole subs, bottom hole assemblies (BHA's), drill string inserts, modules, internal housings and substrate portions thereof.

The lower portion of the formation evaluation tool 120 may include an assembly of several tool segments that are joined end-to-end by threaded sleeves or mutual compression unions 124. An assembly of tool segments suitable for the present invention may include a hydraulic, electrical, or electromechanical power unit 126 and a formation fluid extractor 128. The formation fluid extractor 128 may include an extensible suction probe 138 that is opposed by bore wall feet 140. Both, the suction probe 138 and the opposing feet 140 may be hydraulically or electro-mechanically extensible to firmly engage the well borehole wall. Construction and operational details of a suitable fluid extraction tool 128 are thoroughly described by U.S. Pat. No. 5,303,775, the specification of which is incorporated herein by reference.

A large displacement volume motor/pump unit 130 may be provided below the extractor 128 for line purging. A similar motor/pump unit 132 having a smaller displacement volume may be included in the tool in a suitable location, such as below the large volume pump, for quantitatively monitoring fluid received by the tool 120. One or more sample tank magazine sections (two are shown 134, 136) may be included for retaining fluid samples from the small volume pump 132. Each magazine section 134, 136 may have several fluid sample tanks 106.

In several embodiments to be described in further detail later, the tool 120 includes a downhole spectrometer or other evaluation tool using one or more semiconductor components for generating and/or detecting electromagnetic energy.

Figure 2:
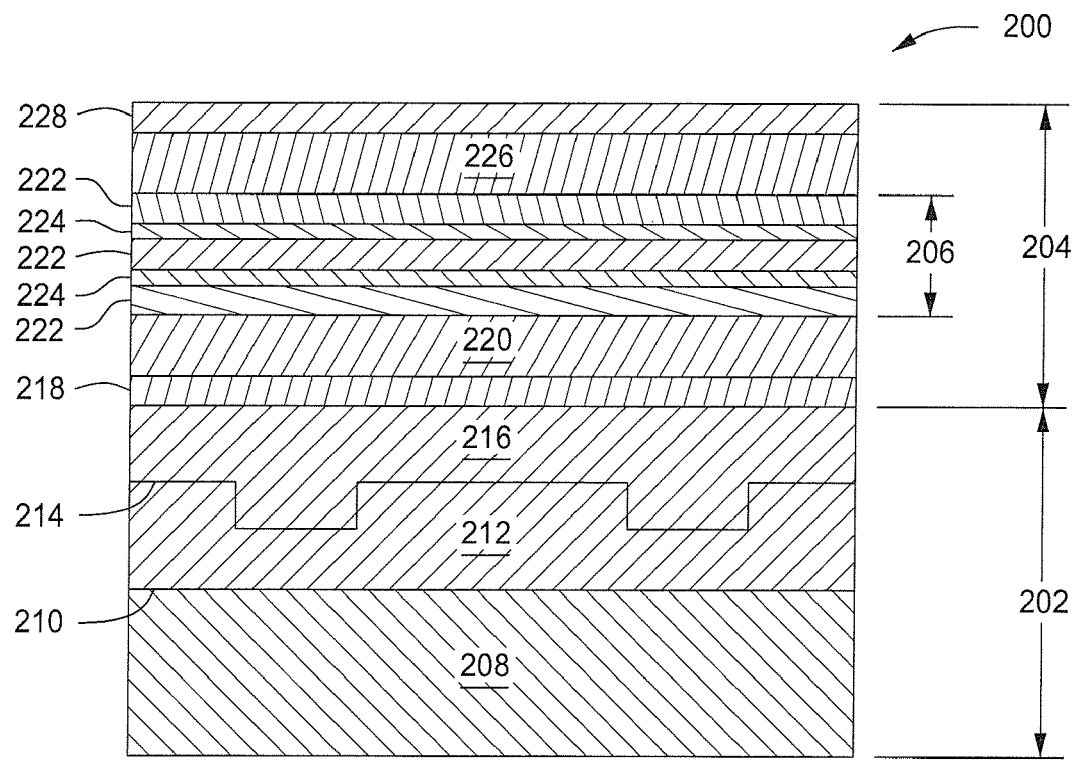
FIG. 2 is a cross section view of a non-limiting semiconductor electromagnetic energy source.

FIG. 2 is a cross section view of a non-limiting gallium-nitride semiconductor 200 for use in hazardous environments including a downhole environment. The gallium-nitride semiconductor 200 may be constructed for operation as any number of semiconductor device, for example a diode, a transistor, a field effect transistor (FET), a laser diode or any other useful semiconductor device using a high-gain media. The example gallium-nitride semiconductor 200 in FIG. 2 illustrates a semiconductor electromagnetic energy source that may be carried into a well borehole for use in downhole spectroscopy. Any carrier may be used to carry the electromagnetic energy source into a well borehole. For example, a carrier comprising a wireline as described above and shown in FIG. 1 may be used. In several embodiments, suitable carriers may include drill strings of the coiled tube type, of the jointed pipe type and any combination or portion thereof, casing pipes, wirelines, wireline sondes, slickline sondes, downhole subs, bottom hole assemblies (BHA's), drill string inserts, modules, internal housings and substrate portions thereof.

The electromagnetic energy source 200 may be configured to emit electromagnetic energy having a wavelength responsive to downhole fluid characteristics. In one or more embodiments, the electromagnetic energy source 200 may comprise a substrate 202, and an electromagnetic energy emitter 204 that includes an electromagnetic energy generating section 206.

In one or more embodiments, the substrate 202 may include several layers forming a template. In one or more embodiments, the substrate 202 may be a hetero-epitaxial lateral overgrowth or more simply, hetero-ELO template 202. The example shown in FIG. 2 illustrates a hetero-ELO template that includes a template substrate 208 with a buffer layer 210 disposed on the template substrate 208. An underlying layer 212 is disposed on the buffer layer 210 and an interlayer 214 is disposed on the underlying layer 212. A nitride-based layer 216 is then disposed on the interlayer 214.

The template substrate 208 may be selected from any suitable material for forming a semi-conductor substrate. In one embodiment, a sapphire material may be used for the substrate 208. In another example, silicon carbide (SiC) or other ceramic may be used. The buffer layer 210 may be a low-temperature buffer layer (LT-Buffer Layer) formed using one or more nitride-based materials such as gallium nitride, aluminum nitride, and gallium aluminum nitride. The underlying layer may utilize a nitride-based material. In one example, the underlying layer includes gallium nitride. The interlayer 214 may be a low-temperature aluminum nitride interlayer (LT-AlN interlayer). The top nitride layer may be selected in part based on the preceding layer materials used. In this example, an aluminum-gallium-nitride (AlGaN) layer is used as the top nitride layer.

The electromagnetic energy emitter 204 may be configured to emit electromagnetic energy of any suitable wavelength or band of wavelengths. In one or more embodiments, the electromagnetic energy emitter emits a broad band of electromagnetic energy. In one or more embodiments, the electromagnetic energy source 200 includes a fluorescent material disposed on a surface of the electromagnetic energy emitter that provides an output approximating a white light source. In one or more embodiments, the electromagnetic energy source 200 comprises a structure for emitting ultra-violet (UV) light. In one or more embodiments, the electromagnetic energy source 200 may include a structure for emitting light having a wavelength corresponding to violet light, e.g. about 405 nm. In one or more embodiments, the wavelength may be in a range of about 380 nm to about 450 nm. In one or more embodiments, the electromagnetic energy emitter 204 may operate as a UV laser diode, a violet light laser diode or there may be a combination of UV and violet laser diodes. In one or more embodiments, a laser diode may be grown on a hetero-epitaxial lateral overgrowth or more simply, hetero-ELO template.

The UV or violet laser diode 204 in this example includes an electromagnetic energy generator 206, which in this example is a multiple quantum well structure. Those skilled in the art with the benefit of the present disclosure will appreciate that structures other than MQW may incorporate the concepts described herein. Thus, other electromagnetic energy generators 206 are within the scope of the disclosure. Examples include, but are not limited to, single quantum wells, quantum dots, quantum dash structures, and quantum wire structures.

The electromagnetic energy emitter 204 includes a lower cladding layer 218 and a guide layer 220 is disposed on the lower cladding layer 218. In one non-limiting example, the lower cladding layer 218 is an n-cladding layer formed using AlGaN and the guiding layer 220 is formed using GaN. The MQW 206 is formed using alternating barrier layers 222 of InGaN material and p-AlGaN blocking layers 224. The number of barrier layers 222 and blocking layers 224 may be selected depending on the number of quantum wells desired. In this example, three quantum wells are formed using two AlGaN blocking layers 224 for raising the energy band of the wells as shown in the band diagram of FIG. 3. An interlayer layer 226 formed using InGaN operates as a guide layer and one or more p-cladding layers 228 are disposed on top of the MQW section 206. The p-cladding layers may be strained layer superlattice cladding layers formed using AlGaN and/or GaN.

Figure 3:
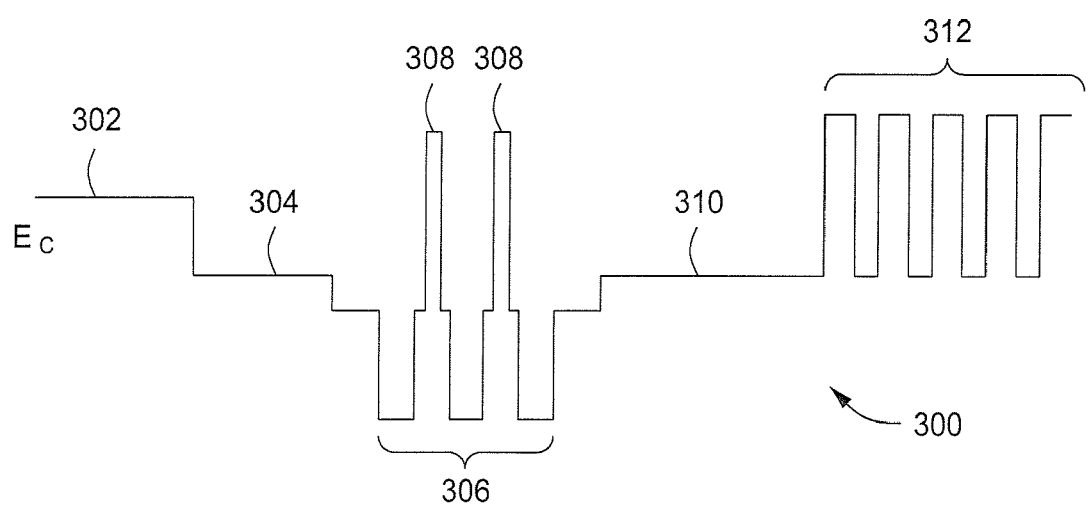
FIG. 3 illustrates a band diagram of the electromagnetic energy source of FIG. 2.

FIG. 3 illustrates a band diagram of the electromagnetic energy source of FIG. 2. The AlGaN electron blocking layers increase the well depth shown in FIG. 3 at 308. The increased well depth provides better performance at high ambient temperatures such as those to be expected in a downhole environment. FIG. 3 is an illustrative conduction band diagram that may be produced where a semiconductor device is constructed in accordance with the device 200 shown in FIG. 2. The Ec band 300 includes a portion 302 associated with the n-AlGaN cladding layer 218. A second band portion 304 is associated with the GaN guide layer 220. The non-limiting structure of FIG. 2 forms 3 MQWs 306 with the extended depth 308 being associated with the p-AlGaN electron blocking layers 224. The Ec band diagram then has a portion 310 associated with the InGaN guiding interlayer 226. In one or more embodiments, the Ec level for sections 304 and 310 are substantially the same where the material ratios are the same. A section 312 is associated with the p-AlGaN or GaN superlattice cladding layers 228 and includes one or more additional blocking layers.

The exemplary semiconductor device 200 described above also illustrates a method of modulation doping that includes modulating the doping of the barrier layers used in quantum wells. Modulating the doping according to the disclosure may be used to shift the Fermi levels and provides a high barrier that helps in the high temperature environment. Modulation doping also increases absorption due to a high concentration of carriers caused by the doping. This tradeoff is useful in the downhole environment and is counterintuitive with respect to the current direction of surface applications for laser diodes. The doping also decreases the electrical resistance of the device. One may also increase the band offset by changing the alloy composition ratio to increase or decrease the strain. Using a highly doped MQW in a GaN device also allows for the creation of intra-cavity contacts that facilitates the manufacturing process.

It should be understood that those skilled in the art with the benefit of the present disclosure will appreciate that other high-gain semiconductor devices may be constructed using the nitride-based semiconductor and/or active region blocking layers described herein. In several non-limiting examples, the semiconductor device may be a diode, a transistor, a field effect transistor (FET), a laser diode or any other useful semiconductor device using a high-gain media. In several embodiments, the high-temperature high-gain media semiconductor device 200 may be modified for use in any number of sensor, communication, switching, amplification and information handling applications.

Figure 4:
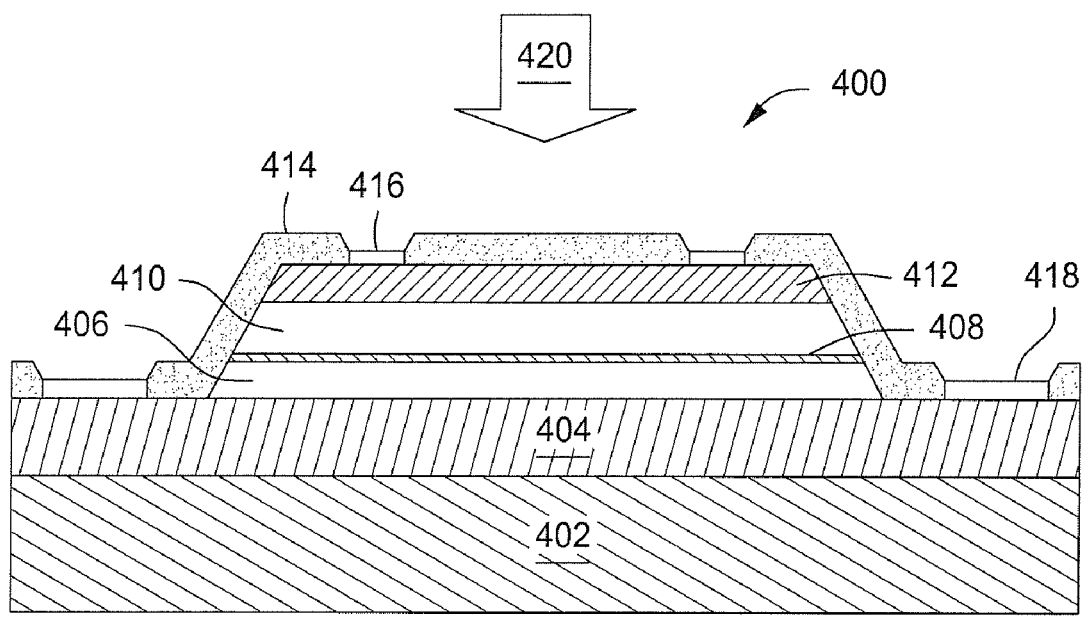
FIGS. 4 and 5 illustrate a non-limiting example of a p-down photodetector according to the disclosure.
Figure 5:
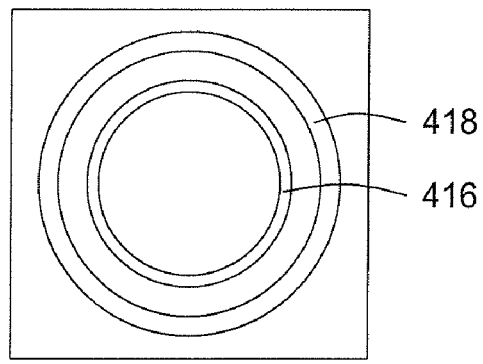

FIGS. 4 and 5 illustrate a non-limiting example of a p-down photodiode according to the disclosure. FIG. 4 is a cross section of a photodiode, also referred to as a photodetector 400. The photodetector 400 may be used to detect any number of electromagnetic energy responses. In several embodiments, the photodetector 400 may be incorporated in a downhole tool, such as the tool 120 described above and shown in FIG. 1. In one or more embodiments, the photodetector 400 may be used in conjunction with the electromagnetic energy source 200 described above and shown in FIG. 2.

The non-limiting photodetector 400 is a semiconductor photodetector that includes a substrate 402 and a multi-layer structure disposed on the substrate. The substrate 402 may include any suitable substrate material. In this example, the substrate includes SiC to provide a substrate for a high temperature photodiode, which may also be used as an avalanche photodetector. Avalanche photodetectors are used slightly above their breakdown voltage and are specifically designed to multiply the electrons rather then the holes. This is due to a higher noise caused by hole multiplication. SiC has a high ratio of the multiplication coefficients for electrons/holes and therefore will be a better suited material system for making avalanche devices.

An n-type layer 404 is disposed on the substrate. A multiplying layer 406 is disposed on the n-type layer 404. A blocking 408 layer is disposed on the multiplying layer 406 and an absorption layer 410 is disposed on the blocking layer 408. A cap layer 412 is positioned on the absorption layer 410 and a mask 414 is deposited over the device with access openings for an upper electrode 416 and a lower electrode 418. The electrodes 416, 418 may be arranged in a p-up or p-down configuration. The configuration shown here is a p-up configuration where the p-electrode is position on an upper mesa of the device.

In operation, electromagnetic energy, which may be in the form of light waves 420, engages the photodiode from above the substrate as shown. The light interacts with the device and an output signal indicative of the light intensity may be detected by connecting one or more leads to the electrodes 416, 418.

The performance of the photodetector may be improved for operation in a downhole environment or other harsh environment by use of the p-carrier blocking layer 408 as shown in this example. The structure size, such as the diameter of the detector wafer may be increased to reduce series resistance and to provide better thermal properties. Increasing the diameter of the wafer also provides for an easier optical coupling scheme.

Those skilled in the art will appreciate that a high-temperature semiconductor device, such as the device 200 described above and shown in FIG. 2 may be used in any number of applications. In one or more embodiments, the high-temperature semiconductor device 200 may be used as part of a downhole spectrometer. Several spectrometer examples will be provided below with reference to FIGS. 6-8.

Figure 6:
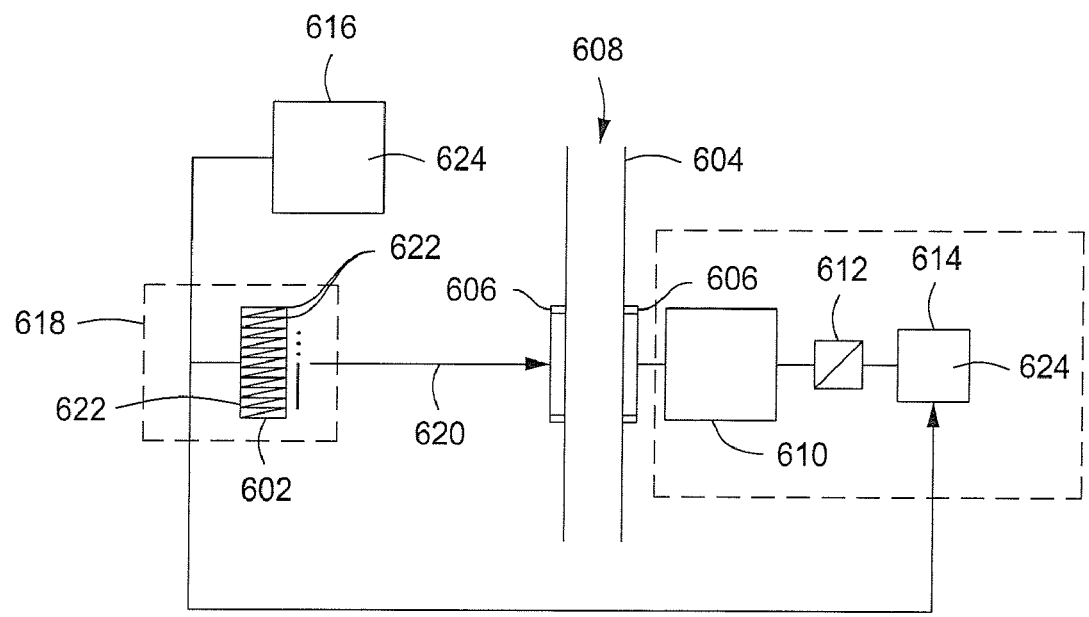
FIG. 6 is a non-limiting example of a downhole spectrometer that may be used with systems such as depicted in FIG. 1.

FIG. 6 schematically illustrates a non-limiting example of a downhole spectrometer 600 according to the disclosure. The downhole spectrometer 600 may be incorporated into any of several wireline tools, including the formation evaluation tool 120 described above and shown in FIG. 1. In other embodiments, the downhole spectrometer may be incorporated into a while-drilling tool, such as the tool 120.

The downhole spectrometer 600 in the example shown includes an electromagnetic energy source 602. In one or more embodiments, the electromagnetic energy source 602 may include a nitride-based semiconductor as described above and shown in FIG. 2 at 200. In one or more embodiments, the electromagnetic energy source 602 may include an array of individual sources 622. The electromagnetic energy source 602 emits energy in the form of light toward a formation fluid cell 604 via an optical path 620. The optical path may be any path that provides optical transmission. In one embodiment, the optical path 620 may include an air gap. In another embodiment, the optical path 620 includes an optical fiber. In one or more embodiments, the optical path 620 may be a direct interface where the electromagnetic energy source 602 is adjacent the window 606 or is in contact with the fluid 608.

The fluid cell 604 includes at least one window 606 for receiving the emitted light, so that the light may interact with fluid 608 within the cell 604. Several configurations of sample cells and windows may be used in other embodiments without departing from the scope of the present disclosure. For example, to measure optical transmittance through a cell, one could use a pair of windows. Transflectance measurements may be conducted using a single window with a mirror behind the window and having the fluid sample between the mirror and window. Attenuated reflectance measurements may be conducted using a single window in contact with the fluid sample. Raman scattering and fluorescence measurements may be conducted using a single window and collecting the resulting light on the same side of the window as the source light. In another example, light may be collected through a second window for Raman scattering and fluorescence measurements. Depending on the opacity of the sample, the second window could collect the resulting light at 90 degrees from the direction of the source light.

Continuing with the example of FIG. 6, a photodetector 610 receives the light after the light interacts with the fluid 606. The photodetector 610, which may be a single broadband photodetector, is responsive to light emitted from the array and provides an output signal indicative of the light received at the photodetector 610 after interaction with the fluid 608. In one or more embodiments, the photodetector 610 may be a SiC photodetector or a GaN detector substantially similar to the photodetector 400 described above and shown in FIG. 4. In some cases, the photodetector output signal may be an analog electrical signal. An analog-to-digital converter 612 may be used to convert the photodetector output signal into a digital signal that is received by a processor 624 that is part of a controller 614, 616. The light emitted from the electromagnetic energy source 602 may be modulated by the processor 624 within the same controller 614 that receives the photodetector output or by a separate controller. In the example shown, one modulator/controller 614 is coupled to the photodetector 610 and a second modulator/controller 616 is coupled to the electromagnetic energy source 602. These controllers may be implemented as a single controller without departing from the scope of the disclosure. In other embodiments, the controller or controllers 614, 616 may be located at the surface of the well borehole. The light emitted from the electromagnetic energy source 602 may be controlled (i.e. modulated) by the controller processor 614, 616. The processor 614, 616 that receives the detector 610 output signal may also receive a signal from the controller 614, 616 modulating the electromagnetic energy source 602.

In one embodiment, the electromagnetic energy source 602 may include one or more light-emitting semiconductors used as individual light sources 622. For example, the electromagnetic energy source 602 may include nitride-based laser diodes as described above and shown in FIG. 2. The laser diodes may all be coupled to a single optical fiber 620, and light from that fiber would interact with the fluid 608 (through transmission or through attenuated reflection) and afterwards be detected by the photodetector 610. In other embodiments, the downhole spectrometer 600 may include arrayed electromagnetic energy sources 602 that are not all lasers, i.e. optical channels that have a wider bandpass (less resolution) than a laser. In these embodiments, an array of light-emitting diodes (LED) may be used.

Cooling one or more of these downhole components may be accomplished using a cooling device 618. The cooling device 618 used may be any number of devices, examples of which include thermal-electric, thermo-tunneling, sorption cooling, evaporators, and Dewar. Cooling is optional where components selected are compatible with the downhole temperature environment. Cooling may be applied where a component operating temperature is lower than the downhole environment and/or were cooling may enhance performance of the component. In several embodiments, the electromagnetic energy source 602 is compatible with the downhole temperature environment. Cooling in some cases could improve photodetector signal-to-noise ratio and increase laser brightness. In one or more embodiments, the photodetector 610 comprises a nitride-based construction compatible with the downhole environment. In one or more embodiments, the photodetector 610 comprises a SiC construction, a material with a wider bandgap compared with GaN and therefore with a better high temperature performance.

Figure 7:
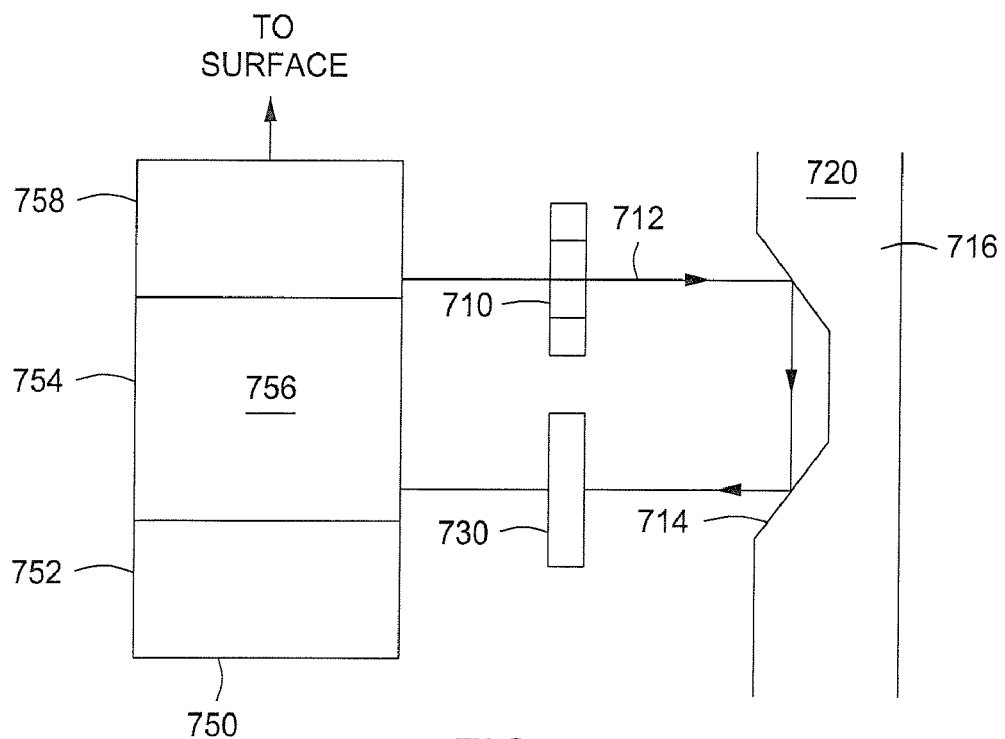
FIGS. 7 and 8 illustrate downhole Raman spectrometer examples according to several embodiments of the disclosure.

Turning now to FIG. 7, a schematic diagram illustrates a Raman spectrometer 700 that may be used downhole for analyzing fluid withdrawn from a formation. Oil-based mud contamination in a formation fluid may be determined using Raman spectroscopy. UV Raman spectroscopy is one part of the spectrum that is of interest due to the large gap between the fluorescence emission and Raman emission. Wide band gap semiconductor materials such as GaN and SiC are excellent candidates for optical sources and detectors in the UV range. These materials possess superior thermal characteristics due to their wide band gap. For example photodetectors built in accordance with the present disclosure and using SiC materials have low leakage current at high temperature. Furthermore, laser diodes described herein, reduced thermal rolloff. In one or more embodiments, a downhole spectrometer may use a reflectance Raman measurement set-up. The Raman signal in the 250 nm case, for example, is only about 5 nm away from the pump and a Raman filter may be used to prevent the pump signal from reaching the photodetector. Such filters are commercially available. In one or more embodiments, a SiC photodetector or a GaN device can be used.

The Raman spectrometer 700 in FIG. 7 includes a nitride-based electromagnetic energy source 710. In one or more embodiments, the electromagnetic energy source 710 may include one or more nitride-based UV lasers used to induce or pump UV light 712 into a fluid 720 through a window 714 made into a wall of a fluid chamber 716. The light path from the electromagnetic energy source 710 to the window 714 may be an optical fiber such as the fiber 620 described above and shown in FIG. 6. The electromagnetic energy source 710 of this example includes multiple lasers producing UV light within a relatively narrow wavelength band. Alternatively, the UV electromagnetic energy source 710 may produce multiple monochromatic (single wavelength) UV light from each of several lasers. The light 722 interacts with the fluid 720 and a portion of the light is reflected back to a detector 730.

The detector 730 according to one or more embodiments may be a SiC photodetector or a nitride-based photodetector such as a GaN detector. The detector 730 produces a signal responsive to the light, which signal is received by a controller 750 for analysis. The controller 750 may further be used as a modulator for the electromagnetic energy source 710 to modulate the light emitted from the source 710.

An advantage of a UV laser diode such as one made from GaN is that, because of its wide bandgap, the laser can operate better at high temperature in that there is less dimming and less chance of lasing cessation than when using a narrower bandgap laser at the high temperatures encountered downhole. Here, the wide bandgap may be extended for better temperature performance using modulation doping as described above with reference to FIG. 2.

Raman spectroscopy is based on the Raman Effect, which is the inelastic scattering of photons by molecules. In Raman scattering, the energies of the incident or pumped photons and the scattered photons are different. The energy of Raman scattered radiation can be less than the energy of incident radiation and have wavelengths longer than the incident photons (Stokes Lines) or the energy of the scattered radiation can be greater than the energies of the incident photons (anti-Stokes Lines) and have wavelengths shorter than the incident photons. Raman spectroscopy analyzes these Stokes and anti-Stokes lines. The spectral separation between the optical pump wavelength and the Raman scattered wavelengths form a spectral signature of the compound being analyzed. Oil-based mud filtrate often has a distinct spectral signature due to the presence of olefins and esters, which do not naturally occur in crude oils. In this way, Raman spectroscopy can be used to calculate the percentage of oil based mud filtrate contamination of crude oil samples as they are being collected downhole. One can continue withdrawing and discarding oil removed from the downhole formation until the contamination falls below a desired level, and then the clean sample may be diverted into a sample collection tank. However, fluorescence from aromatics in the fluid sample, often has much higher intensity, and can interfere or obscure certain Raman signals. By using source lights having a wavelength around 250 nm or less, the Raman spectrum is completed at wavelengths shorter than those at which fluorescence begins and, therefore, interference is eliminated.

Thus, in one aspect, the electromagnetic energy source 710 produces UV light at wavelengths near or below (shorter than) 250 nm. The detector 730 may be a SiC or GaN detector as described above that can detect spectra of the Raman scatters corresponding to the light emitted by the source 710.

The light detected by the detector 730 passes to the controller 750. The controller may include a processor 752, and memory 754 for storing data and computer programs 756. The controller 750 receives and processes the signals received from the detector 730. In one aspect, the controller 750 may analyze or estimate the detected light and transmit a spectrum of the Raman scattered light to a surface controller using a transmitter 758. In one aspect, the controller 750 may analyze or estimate one or more properties or characteristics of the fluid downhole and transmit the results of the estimation to a surface controller using the transmitter 758. In another aspect, the controller 750 may process the signals received from the detector 730 to an extent and telemeter the processed data to a surface controller for producing a spectrum and for providing an in-situ estimate of a property of the fluid, including the contamination level of the mud in the formation fluid.

Figure 8:
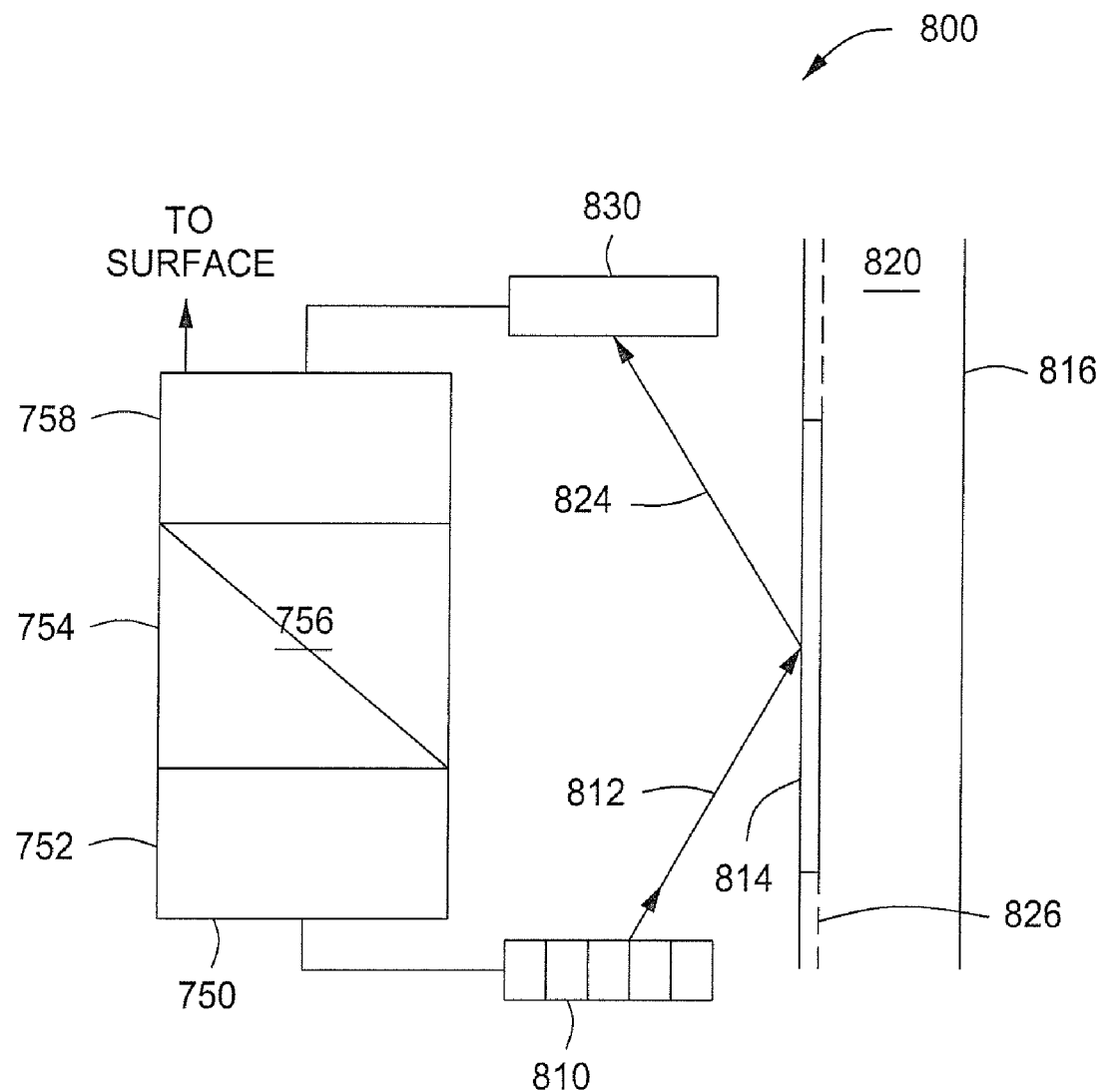

FIG. 8 is a non-limiting schematic diagram showing a portion of a surface-enhanced Raman spectrometer 800 for estimating a property of a fluid according to one embodiment of the disclosure. The exemplary spectrometer 800 shown includes a chamber 816 for holding a fluid 820 to be analyzed. The fluid 820 may be stationary or it may be passing through the chamber 816. The chamber 816 includes a window 814 for allowing light to pass to the fluid 820. The spectrometer 800 includes an electromagnetic energy source 810 that emits electromagnetic energy 812 having one or more selected wavelengths. In one or more embodiments, the electromagnetic energy source 810 may be a laser emitting several desired wavelengths or bands of wavelengths. A controller 750, similar to the controller 750 described above and shown in FIG. 7, controls the operation of the electromagnetic energy source 810 to modulate the source output. The light path from the electromagnetic energy source 810 to the window 814 may be an optical fiber such as the fiber 620 described above and shown in FIG. 6. The incident energy 812 enters the chamber 816 through the window 814 at a selected angle. The Raman scattered light 824 from the fluid 820 leaves the window 814. A semiconductor detector 830, which may be a SiC detector or may be a nitride-based detector such a GaN detector described above and shown in FIG. 4, detects the Raman spectra. A processor 752 receives the signals from the detector 830 and processes the signals to estimate a property of the fluid 820. The controller 750 may further include memory 754 and programs 756 for storing information and for controlling the tool. Likewise, a transmitter 758 may be used for communication with surface-located components.

Fluorescence can interfere with the Raman signals, so to increase the intensity of the Raman signal, an inside surface of the chamber 816 including the inside surface of the window 814 may be coated with conductive particles 826. The conductive particles 826 may be placed in the form of scattered metallic particles, a lattice type structure, or in any other suitable form that will enhance the Raman scattered light. The conductive particles can enhance the Raman Effect due to Plasmon resonance, which consists of energy exchange between the Raman signals and a surface wave that exists in a conductive layer, such as the layer of particles 826. The spectrometer 800 may be used downhole for in-situ analysis of a fluid, such as the fluid withdrawn from a formation or at the surface, to estimate one or more properties or characteristics of the fluid.

Having described above the several aspects of the disclosure, one skilled in the art will appreciate several particular embodiments useful in estimating one or more properties of a downhole fluid in-situ.

In one particular embodiment, an apparatus for estimating a property of a downhole fluid includes a carrier that is conveyed in a borehole, and a semiconductor electromagnetic energy source carried by the carrier, the semiconductor electromagnetic energy source having an active region that includes one or more nitride-based barrier layers that are modulation-doped using a nitride-based doped layer.

Another particular embodiment for estimating a property of a downhole fluid includes a semiconductor electromagnetic energy source that comprises a UV electromagnetic energy emitter. In one embodiment, the UV electromagnetic energy emitter includes a UV laser.

Another particular embodiment for estimating a property of a downhole fluid includes one or more nitride-based barrier layers that include at least one InGaN layer. The nitride-based doped layer may include a p-doped layer, and the p-doped layer may include AlGaN.

Another particular embodiment for estimating a property of a downhole fluid includes a nitride-based doped layer comprising a p-blocking layer that is disposed between two barrier layers.

In yet another particular embodiment for estimating a property of a downhole fluid, a detector responsive to an interaction between the emitted electromagnetic energy and the downhole fluid may be used, wherein the downhole fluid property is estimated at least in part using an output signal from the detector. In one or more embodiments, the detector comprises a SiC photodetector or a GaN photodetector. The output signal may be indicative of a downhole fluorescence property.

Another particular embodiment for estimating a property of a downhole fluid includes a semiconductor electromagnetic energy source that emits monochromatic electromagnetic energy.

Another particular embodiment for estimating a property of a downhole fluid includes a semiconductor electromagnetic energy source that includes one or more quantum wells, quantum wires, quantum dots and quantum dashes.

A method for estimating a property of a downhole fluid includes conveying a carrier in a borehole and carrying a semiconductor electromagnetic energy source in a borehole using the carrier, the semiconductor electromagnetic energy source having an active region that includes one or more nitride-based barrier layers that are modulation-doped using a nitride-based doped layer. The method may further include emitting electromagnetic energy from the emitter toward the downhole fluid in-situ and detecting an interaction between the emitted electromagnetic energy and the downhole fluid using a detector. The downhole fluid property is estimated at least in part using an output signal from the detector.

A particular method for estimating a property of a downhole fluid includes emitting electromagnetic energy in the form of monochromatic electromagnetic energy, narrow band electromagnetic energy, wide band electromagnetic energy or a combination thereof.

In one particular method for estimating a property of a downhole fluid, emitting electromagnetic energy includes emitting electromagnetic energy of at least one UV wavelength.

One particular method for estimating a property of a downhole fluid includes detecting an interaction between emitted electromagnetic energy and the downhole fluid using a semiconductor SiC photodetector.

Another particular method for estimating a property of a downhole fluid includes detecting a fluorescence property of the downhole fluid.

The present disclosure is to be taken as illustrative rather than as limiting the scope or nature of the claims below. Numerous modifications and variations will become apparent to those skilled in the art after studying the disclosure, including use of equivalent functional and/or structural substitutes for elements described herein, use of equivalent functional couplings for couplings described herein, and/or use of equivalent functional actions for actions described herein. Such insubstantial variations are to be considered within the scope of the claims below.

Given the above disclosure of general concepts and specific embodiments, the scope of protection is defined by the claims appended hereto. The issued claims are not to be taken as limiting Applicant's right to claim disclosed, but not yet literally claimed subject matter by way of one or more further applications including those filed pursuant to the laws of the United States and/or international treaty.

What is claimed is:

1. A gallium-nitride semiconductor apparatus comprising:
   an active region having one or more nitride-based barrier layers that are modulation-doped using a nitride-based doped layer wherein the one or more modulation-doped nitride-based barrier layers are configured to shift Fermi levels and provide a barrier in order for the gallium-nitride semiconductor to operate at high temperatures experienced in a downhole environment.

2. An apparatus according to claim 1, wherein the one or more nitride-based barrier layers include at least one InGaN layer.

3. An apparatus according to claim 1, wherein the nitride-based doped layer comprises a p-doped layer.

4. An apparatus according to claim 3, wherein the p-doped layer comprises AlGaN.

5. An apparatus according to claim 1, wherein the nitride-based doped layer comprises p-blocking layer that is disposed between two barrier layers.

6. An apparatus according to claim 1, wherein the active region comprises at least a portion of a semiconductor junction.

7. An apparatus according to claim 1, wherein the active region includes one or more quantum wells.

8. An apparatus according to claim 1, wherein the active region includes one or more of quantum wires, quantum dots and quantum dashes.

9. An apparatus according to claim 1 further comprising a substrate, the active region being disposed on the substrate.

10. An apparatus according to claim 9, wherein the substrate includes a layer of sapphire.

11. An apparatus according to claim 9, wherein the substrate includes a multi-layer template.

12. An apparatus according to claim 9, wherein the multi-layer template includes a plurality of nitride-based layers.

13. A gallium-nitride semiconductor apparatus comprising:
   an active region having one or more nitride-based barrier layers that are modulation-doped using a nitride-based doped layer; and
   an electromagnetic energy emitter that includes the active region, the active region including an electromagnetic energy generator, the electromagnetic energy emitter and electromagnetic energy generator comprising a nitride-based laser.

14. A gallium-nitride semiconductor apparatus comprising:
   an active region having at least two nitride-based barrier layers; and
   a nitride-based blocking layer disposed between the at least two barrier layers wherein the nitride-based blocking layer is configured to increase an energy band in order for the gallium-nitride semiconductor to operate at high temperatures experienced in a downhole environment.

15. An apparatus according to claim 14, wherein each of the at least two barrier layers comprise an InGaN layer.

16. An apparatus according to claim 14, wherein the blocking layer comprises a p-doped layer.

17. An apparatus according to claim 16, wherein the p-doped layer comprises AlGaN.

18. An apparatus according to claim 14, wherein the active region comprises at least a portion of a semiconductor junction.

19. An apparatus according to claim 14, wherein the active region includes an MQW structure.

20. An apparatus according to claim 14, wherein the active region includes one or more of quantum wires, quantum dots and quantum dashes.

* * * * *